(12) United States Patent
Lee

(10) Patent No.: US 9,234,112 B2
(45) Date of Patent: Jan. 12, 2016

(54) METAL PRECURSOR POWDER, METHOD OF MANUFACTURING CONDUCTIVE METAL LAYER OR PATTERN, AND DEVICE INCLUDING THE SAME

(71) Applicant: KOREA INSTITUTE OF MACHINERY & MATERIALS, Daejeon (KR)

(72) Inventor: Hye Moon Lee, Changwon (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 90 days.

(21) Appl. No.: 14/091,666

(22) Filed: Nov. 27, 2013

(65) Prior Publication Data

US 2014/0360762 A1 Dec. 11, 2014

(30) Foreign Application Priority Data

Jun. 5, 2013 (KR) .................. 10-2013-0064957
Jun. 19, 2013 (KR) .................. 10-2013-0070463

(51) Int. Cl.
*H05K 1/09* (2006.01)
*C09D 11/52* (2014.01)

(52) U.S. Cl.
CPC ............... *C09D 11/52* (2013.01); *H05K 1/092* (2013.01)

(58) Field of Classification Search
CPC ............ H05K 3/12; H05K 3/20; H01L 21/02; H01L 21/28; H01L 21/36; H01L 21/48; H01M 4/04; H01M 4/36; H01M 4/58; H01M 4/60; H01M 4/86; H01M 4/88; H01M 4/90; C08J 3/02

USPC ............ 174/257; 427/77, 123, 125; 428/172, 428/403, 407; 429/213, 231.8, 405, 480; 438/104, 106, 585; 516/100

See application file for complete search history.

(56) References Cited

U.S. PATENT DOCUMENTS

| 4,101,716 | A * | 7/1978 | Horowitz et al. | 429/405 |
|---|---|---|---|---|
| 5,647,203 | A * | 7/1997 | Abe et al. | 60/274 |
| 5,802,845 | A * | 9/1998 | Abe et al. | 60/274 |
| 6,023,130 | A * | 2/2000 | Sakasegawa et al. | 313/582 |
| 6,074,893 | A * | 6/2000 | Nakata et al. | 438/106 |
| 7,550,513 | B2 * | 6/2009 | Hirakoso et al. | 516/100 |
| 7,618,606 | B2 * | 11/2009 | Fan et al. | 423/230 |
| 2003/0148024 | A1 * | 8/2003 | Kodas et al. | 427/125 |
| 2003/0180451 | A1 * | 9/2003 | Kodas et al. | 427/123 |
| 2005/0191492 | A1 * | 9/2005 | Yadav | 428/407 |
| 2005/0268992 | A1 * | 12/2005 | Kagohashi et al. | 148/277 |
| 2006/0127304 | A1 * | 6/2006 | Fujii et al. | 423/644 |
| 2007/0096062 | A1 * | 5/2007 | Kodas et al. | 252/500 |
| 2007/0096063 | A1 * | 5/2007 | Kodas et al. | 252/500 |
| 2007/0096064 | A1 * | 5/2007 | Kodas et al. | 252/500 |

(Continued)

FOREIGN PATENT DOCUMENTS

| KR | 10-2007-0052161 | 5/2007 |
|---|---|---|
| KR | 10-2011-0107034 | 9/2011 |

(Continued)

*Primary Examiner* — Xiaoliang Chen
(74) *Attorney, Agent, or Firm* — Lex IP Meister, PLLC

(57) ABSTRACT

A metal precursor powder, a method of manufacturing a conductive metal layer or pattern, and an electronic device including the same, are provided, and in the metal precursor powder, the Gibbs free energy change of hydrogen removal at a temperature range of −25° C. to 25° C. is −100 kJ/mol to 300 kJ/mol.

24 Claims, 7 Drawing Sheets

(56) References Cited

U.S. PATENT DOCUMENTS

| | | | |
|---|---|---|---|
| 2007/0096065 A1* | 5/2007 | Kodas et al. | 252/500 |
| 2007/0099330 A1* | 5/2007 | Kodas et al. | 438/64 |
| 2007/0102677 A1* | 5/2007 | Kodas et al. | 252/500 |
| 2007/0102678 A1* | 5/2007 | Kodas et al. | 252/500 |
| 2007/0102679 A1* | 5/2007 | Kodas et al. | 252/500 |
| 2007/0102680 A1* | 5/2007 | Kodas et al. | 252/500 |
| 2007/0102681 A1* | 5/2007 | Kodas et al. | 252/500 |
| 2007/0102682 A1* | 5/2007 | Kodas et al. | 252/500 |
| 2007/0102683 A1* | 5/2007 | Kodas et al. | 252/500 |
| 2007/0102684 A1* | 5/2007 | Kodas et al. | 252/500 |
| 2007/0102685 A1* | 5/2007 | Kodas et al. | 252/500 |
| 2007/0104869 A1* | 5/2007 | Kodas et al. | 427/256 |
| 2007/0104870 A1* | 5/2007 | Kodas et al. | 427/256 |
| 2007/0104875 A1* | 5/2007 | Kodas et al. | 427/375 |
| 2007/0104876 A1* | 5/2007 | Kodas et al. | 427/375 |
| 2007/0104879 A1* | 5/2007 | Kodas et al. | 427/375 |
| 2007/0104880 A1* | 5/2007 | Kodas et al. | 427/375 |
| 2007/0104881 A1* | 5/2007 | Kodas et al. | 427/375 |
| 2007/0104882 A1* | 5/2007 | Kodas et al. | 427/375 |
| 2007/0104883 A1* | 5/2007 | Kodas et al. | 427/376.2 |
| 2007/0120096 A1* | 5/2007 | Kodas et al. | 252/500 |
| 2007/0120097 A1* | 5/2007 | Kodas et al. | 252/500 |
| 2007/0120098 A1* | 5/2007 | Kodas et al. | 252/500 |
| 2007/0120099 A1* | 5/2007 | Kodas et al. | 252/500 |
| 2007/0125989 A1* | 6/2007 | Kodas et al. | 252/500 |
| 2007/0181844 A1* | 8/2007 | Kodas et al. | 252/1 |
| 2007/0207565 A1* | 9/2007 | Kodas et al. | 438/61 |
| 2007/0221887 A1* | 9/2007 | Kodas et al. | 252/500 |
| 2007/0254156 A1* | 11/2007 | Yoshida | 428/403 |
| 2008/0070777 A1* | 3/2008 | Jang et al. | 502/101 |
| 2008/0093422 A1* | 4/2008 | Kodas et al. | 228/188 |
| 2008/0093423 A1* | 4/2008 | Kodas et al. | 228/225 |
| 2008/0096093 A1* | 4/2008 | Jang et al. | 429/42 |
| 2008/0108218 A1* | 5/2008 | Kodas et al. | 438/610 |
| 2008/0131782 A1* | 6/2008 | Hagiwara et al. | 429/231.95 |
| 2008/0299029 A1* | 12/2008 | Grosboll et al. | 423/447.1 |
| 2009/0098421 A1* | 4/2009 | Mills | 429/17 |
| 2009/0110889 A1* | 4/2009 | Toyoda | 428/206 |
| 2009/0263316 A1* | 10/2009 | Iyer et al. | 423/658.3 |
| 2010/0022078 A1* | 1/2010 | Rockenberger et al. | 438/585 |
| 2010/0034986 A1* | 2/2010 | Kodas et al. | 427/597 |
| 2010/0072435 A1* | 3/2010 | Honda et al. | 252/519.51 |
| 2010/0184253 A1* | 7/2010 | Hirai et al. | 438/104 |
| 2011/0201834 A1* | 8/2011 | Kim et al. | 556/9 |
| 2012/0015152 A1* | 1/2012 | Takahashi et al. | 428/172 |
| 2012/0064406 A1* | 3/2012 | Sato et al. | 429/213 |
| 2014/0170501 A1* | 6/2014 | Takahata | 429/231.8 |
| 2014/0193739 A1* | 7/2014 | Takahashi et al. | 429/480 |
| 2014/0251428 A1* | 9/2014 | Lindstrom et al. | 136/256 |

FOREIGN PATENT DOCUMENTS

| | | |
|---|---|---|
| KR | 10-1124620 | 3/2012 |
| KR | 10-1195545 | 10/2012 |

* cited by examiner

METAL PRECURSOR POWDER, METHOD OF MANUFACTURING CONDUCTIVE METAL LAYER OR PATTERN, AND DEVICE INCLUDING THE SAME

CROSS-REFERENCE TO RELATED APPLICATION

This application claims priority to and the benefit of Korean Patent Application No. 10-2013-0064957 and 10-2013-0070463 filed in the Korean Intellectual Property Office on Jun. 5, 2013 and Jun. 19, 2013, the entire contents of which are incorporated herein by reference.

BACKGROUND OF THE INVENTION (a) Field of the Invention

The present invention relates to a metal precursor powder, a method of manufacturing a conductive metal layer or pattern, and an electronic device including the same.

(b) Description of the Related Art

Metal electrodes have been utilized in various technical fields. Of these metal electrodes, as an example, an aluminum (Al) electrode is excellent in view of several electrical properties, such as electrical conductivity and work function, and is economical, and thus aluminum (Al) is utilized as an essential electrode material for various electronic, electric, energetic, and environmental devices.

More specifically, aluminum has the forth best electrical conductivity in metals on the earth, following silver, copper, and gold and has a very low work function, so that aluminum is very largely used in an electrode material requiring ohmic contact as well as an electrode material for charge transfer. Further, aluminum is very inexpensive. Therefore, aluminum may be a very attractive material as a next-generation electrode material.

However, since aluminum has high reactivity to moisture and oxygen, it is very difficult to subject aluminum to wet coating and printing. Currently, thin film types of electrodes are formed only through a vacuum deposition process other than in a technology according to which an electrode having a thickness of several micrometers or larger is formed by coating a paste on a rear electrode of a silicon solar cell through a screen printing process, the paste being composed of a micrometer-sized aluminum powder, and conducting heat treatment at a high temperature of 800° C. or higher.

The vacuum deposition process is very effective in implementing a pure aluminum layer having a desired thickness, but has problems in that the vacuum deposition apparatus is very expensive, the time and energy needed for maintaining a vacuum state are respectively long and high, and 70% or more of raw materials are lost. Considering these problems, in the case where large-area electrodes are needed like in $7^{th}$ and $8^{th}$ generation display devices, a vacuum chamber having a volume appropriate for the area is needed and the time and energy needed for maintaining a vacuum state of the vacuum chamber are further increased. Therefore, the vacuum deposition process may be very inappropriate in view of economic feasibility.

However, the wet printing and coating processes have an advantage in that an electrode with a desired shape can be formed in a very short time under a normal pressure atmosphere. Recently, many efforts to replace all technologies through the vacuum deposition process by the wet printing and coating process have been made.

However, most inks used in the wet printing and coating process are composed of an expensive gold or silver powder, of which the size is very large at a micrometer level, so that a high-temperature heating process is needed for contact and connection between powder particles.

As mentioned above, the paste composed of the aluminum powder having a 10 micrometer-level particle diameter is used. However, the aluminum powder, unlike gold or silver powder, has very large oxidation property and thus an oxidized film is formed on a surface of the aluminum powder. Therefore, in order to manufacture an electrically conductive layer by using an aluminum paste, it is necessary to conduct a heat treatment process at a high temperature of 800° C. or higher to thereby break the oxidized film on the surface of the aluminum powder and connect pure aluminum powder particles, which come out from the surrounding aluminum powder through the broken oxidized film.

That is, it is necessary to conduct heat treatment at a high temperature of 800° C. or higher in order to manufacture a conductive layer by using an aluminum paste. Therefore, it is impossible to apply aluminum as an electrode material in fields of recent organic electronic devices, flexible electronic devices, stretchable electronic devices, and the like, employing a substrate or an organic functional material, which is venerable to high temperatures.

In order to implement an aluminum layer having high electrically conductivity at a low temperature, recently published Korean Patent Registration Nos. 10-1021087 and 10-1195545 disclose developments of technology of realizing an aluminum layer having high electrical conductivity at room temperature to 150° C. by using a solution in which a material having various organic substances attached to an aluminum precursor, for example hydrogenated aluminum ($AlH_3$), is dissolved in a particular solvent.

However, since the hydrogenated aluminum has very low solubility to the solvent, a significant amount of the aluminum precursor, hydrogenated aluminum, is precipitated from the aluminum precursor ink prepared according to the above patents in a very short time. Therefore, the concentration of the aluminum precursor ink cannot be maintained in a uniform state for a long time and thus the thickness of the finally formed aluminum layer is difficult to uniformly maintain, thus failing to uniformly maintain electrical characteristics of all the prepared aluminum layers.

Accordingly, there is need for a method of manufacturing a high-conductivity aluminum layer through wet printing and coating, the method being capable of solving the above problems and securing an aluminum precursor ink that is physically/chemically stable for a long time.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a metal precursor powder having advantages of solving physical instability when a metal precursor is precipitated in a solution by preparing various kinds of metal precursors in a powder type and having chemical stability by stably storing the prepared precursor powder to prevent a decomposition reaction of the metal precursor powder.

The present invention has been made in an effort to provide a method of manufacturing a metal layer having advantages of having a uniform thickness and uniform electrical characteristics by dissolving a stored metal precursor powder in a solvent to prepare a metal precursor ink when the metal precursor ink is needed, and then subjecting the prepared metal precursor ink to a liquid phase process such as wet printing and/or coating and/or a gas phase process such as CVD or ALD.

Various metal layers (or patterns) prepared through the above method are used to provide, with a relatively simple and low-cost process, electrodes and charge collectors of organic light emitting diodes (OLEDs), solar cells, secondary batteries, super capacitors, displays, and the like, which have similar or improved performances as compared with the conventional products, and provide materials that give high conductivity to circuits of circuit boards, radio-frequency identification (RFID) tags, electronic fiber devices, flexible electronic devices, and various organic/inorganic electronic devices, representative examples of the materials being charge collectors, circuits, antennas, and electromagnetic wave shielding films.

An embodiment of the present invention provides a metal precursor powder of which Gibbs free energy change of hydrogen removal at a temperature range of −25° C. to 25° C. is −100 kJ/mol to 300 kJ/mol.

The metal precursor powder may be an aluminum precursor powder, and the Gibbs free energy change of hydrogen removal at a temperature range of −25° C. to 25° C. may be −27 kJ/mol to −37 kJ/mol.

Herein, a metal precursor of the metal precursor powder is a metal chloride, a metal hydride, a metal hydroxide, a metal sulfide, a metal nitrate, a metal nitride, a metal halide, a metal alkyl compound, a metal aryl compound, a complex compound thereof, or a combination thereof.

Another embodiment of the present invention provides a method of manufacturing a conductive metal layer or pattern, the method including: preparing a metal precursor powder; storing the metal precursor powder in a stable atmosphere in which a decomposition reaction fails to occur; dissolving the stored metal precursor powder in a first solvent to prepare a first metal precursor ink; forming the first metal precursor ink into a layer or pattern on a subject substrate; and decomposing a metal precursor in the formed layer or pattern to form a conductive metal layer or pattern.

The preparing of the metal precursor powder may include: preparing a second metal ink by mixing a metal precursor raw material, a reducing agent, a second solvent, and optionally an organic or inorganic ligand raw material; and removing the solvent in the second metal precursor ink to obtain the metal precursor powder.

The preparing of the second metal ink by mixing the metal precursor raw material, the reducing agent, the second solvent, and optionally the organic or inorganic ligand raw material may include mixing the metal precursor raw material, the reducing agent, the second solvent, and optionally the organic or inorganic ligand raw material to induce a reaction, and removing unreacted materials or/and byproducts.

Herein, in the mixing of the metal precursor raw material, the reducing agent, the second solvent, and optionally the organic or inorganic ligand raw material to induce the reaction, and the removing of the unreacted materials or/and byproducts, the unreacted materials or/and byproducts may be removed by using a filter, a centrifugal separator, or a combination thereof.

The first solvent and the second solvent may each independently be an ether-based solvent, a benzene-based solvent, an alkyl sulfide-based solvent, an amide-based solvent, an amine-based solvent, a nitrile-based solvent, an alkane-based solvent, a thiol-based solvent, a halogenated hydrocarbon-based solvent, an alcohol-based solvent, an aldehyde-based solvent, a ketone-based solvent, a mercaptan-based solvent, a carboxylic acid-based solvent, a mineral acid-based solvent, a toluene-based solvent, a polyol-based solvent, or a combination thereof.

In the removing of the solvent in the second metal precursor ink to obtain the metal precursor powder, a drying oven apparatus, a rotary evaporator apparatus, a freeze-drying apparatus, or a combination thereof may be used.

In the storing of the metal precursor powder in the stable atmosphere in which a decomposition reaction fails to occur, the metal precursor powder may be stored at a temperature range of −25° C. to 25° C.

In the storing of the metal precursor powder in the stable atmosphere in which a decomposition reaction fails to occur, the metal precursor powder may be stored at a temperature range of 0° C. to 10° C.

In the storing of the metal precursor powder in the stable atmosphere in which a decomposition reaction fans to occur, the metal precursor powder may be stored at a temperature range of −25° C. to 0° C.

In the dissolving of the stored metal precursor powder in the first solvent to prepare the first metal precursor ink, metal precursor powder residues or impurity residues may be removed by using a filter, a centrifugal separator, or a combination thereof.

In the dissolving of the stored metal precursor powder in the first solvent to prepare the first metal precursor ink, the first metal precursor ink may contain 0.01 to 75 wt % of the metal precursor powder and 25 to 99.99 wt % of the first solvent.

In the forming of the first metal precursor ink into the layer or pattern on the subject substrate, a liquid or gas phase process may be conducted.

In the decomposing of the metal precursor in the formed layer or pattern to form a conductive metal layer or pattern, a heat source, a light source, or a combination thereof may be used to supply energy to induce the decomposition of the metal precursor in the layer or pattern formed on the substrate.

The method may further include, before the forming of the first metal precursor ink into the layer or pattern on the subject substrate, raising the temperature of the subject substrate to 25° C. to 300° C.

In the decomposing of the metal precursor in the formed layer or pattern to form a conductive metal layer or pattern, the formed conductive metal layer or pattern may have electrical specific resistivity of 1.5 to 500 $\mu\Omega\cdot$cm.

Yet another embodiment of the present invention provides a method of manufacturing a conductive metal layer or pattern, the method including: preparing a metal precursor powder; storing the metal precursor powder in a stable atmosphere in which a decomposition reaction fails to occur; dissolving the stored metal precursor powder in a first solvent to prepare a first metal precursor ink; treating a surface of a subject substrate with a metal precursor decomposition activating catalyst; forming the first metal precursor ink into a layer or pattern on the surface of the subject substrate, which is treated with the metal precursor decomposition activating catalyst; and decomposing a metal precursor in the formed layer or pattern to form a conductive metal layer or pattern.

In the decomposing of the metal precursor in the formed layer or pattern to form the conductive metal layer or pattern, energy for inducing the decomposition of the metal precursor in the layer or pattern formed on the substrate may be supplied by using a heat source, a light source, or a combination thereof.

In the treating of the surface of the subject substrate with the metal precursor decomposition activating catalyst, the treating may be conducted by directly exposing the surface of the subject substrate to the metal precursor decomposition activating catalyst.

In the treating of the surface of the subject substrate with the metal precursor decomposition activating catalyst, the subject substrate may be dipped in the metal precursor decomposition activating catalyst.

In the treating of the surface of the subject substrate with the metal precursor decomposition activating catalyst, the subject substrate may be stored in a chamber containing a fumed metal precursor decomposition activating catalyst.

The metal precursor decomposition activating catalyst may be a combination of a group 4B or 5B metal and a halogen group element or an alkoxide material.

The metal precursor decomposition activating catalyst may be $ZrCl_4$, $NbCl_4$, $VOCl_2$, $VOCl_3$, $TiCl_4.2[(C_2H_5)_2O]$, $TiCl_4$, $TiBr_4$, $VCl_4$, $Ti(OC_2H_5)_2Cl_2$, $TiCl_2(i-OC_3H_7)_2$, $TiCl_2.2[(C_2H_5)_2O]$, $Ti(O-i-Pr)_4$, $Ti(OEt)_4$, $Ti(OMt)_4$, $Zr(OEt)_4$, $Zr(OMt)_4$, Co, W, Mo, Pd, Pt, or a mixture thereof.

In the decomposing of the metal precursor in the formed layer or pattern to form the conductive metal layer or pattern, the formed conductive metal layer or pattern may have an electrical specific resistivity of 1.5 to 500 $\mu\Omega\cdot cm$.

Yet another embodiment of the present invention provides a method of manufacturing a conductive metal layer or pattern, the method including: preparing a metal precursor powder; storing the metal precursor powder in a stable atmosphere in which a decomposition reaction fails to occur; dissolving the stored metal precursor powder in a first solvent to prepare a first metal precursor ink; forming the first metal precursor ink into a layer or pattern on a surface of a subject substrate; treating the formed layer or pattern with a metal precursor decomposition activating catalyst; and decomposing a metal precursor in the formed layer or pattern to form a conductive metal layer or pattern.

In the above embodiment, the time when the step of treating with the catalyst treatment is conducted is different compared with another embodiment. Since specific descriptions of the other steps are the same as described above, the descriptions thereof will be omitted.

Yet another embodiment of the present invention provides a device including the conductive metal layer or pattern manufactured by the foregoing method, the device being any one of an electronic device, an optical device, and/or a mechanical device.

According to an embodiment of the present invention, a physically/chemically stable metal precursor ink can be provided.

By using the metal precursor ink, a uniform shape of a metal layer (or a metal pattern) exhibiting uniform electrical characteristics can be manufactured.

The metal layer (or metal pattern) can be manufactured by using most liquid phase processes and/or most gas phase processes.

More specifically, the metal layer (or metal pattern) can be manufactured by storing the metal precursor powder in a stable state and then preparing the metal precursor ink at a desired time.

DETAILED DESCRIPTION OF THE EMBODIMENTS

Figure 1:
FIG. 1 is a general optical image of an aluminum metal precursor powder ($AlH_3N(CH_3)_3$) according to Example 1.

Hereinafter, embodiments of the present invention will be described in detail. However, these embodiments are merely exemplified, and the scope of protection of the present invention is not limited thereto but defined by the appended claims.

As used herein, for example, the term "C20" refers to 20 carbon atoms.

As used herein, the term "substitution" refers to, unless separately defined, the replacement of at least one hydrogen atom in a substituent or compound with a deuterium, a halogen group, a hydroxy group, an amino group, a substituted or unsubstituted C1-C30 amine group, a nitro group, a substituted or unsubstituted C3-C40 silyl group, a C1-C30 alkyl group, a C1-C10 alkylsilyl group, a C3-C30 cycloalkyl group, a C6-C30 aryl group, a C1-C20 alkoxy group, a fluoro group, a C1-C10 trifluoroalkyl group such as a trifluoromethyl group, or a cyano group.

In addition, two adjacent substituents of the substituted halogen group, hydroxyl group, amino group, substituted or unsubstituted C1-C20 amine group, nitro group, substituted or unsubstituted C3-C40 silyl group, C1-C30 alkyl group, C1-C10 alkylsilyl group, C3-C30 cycloalkyl group, C6-C30 aryl group, C1-C20 alkoxy group, fluoro group, C1-C10 trifluoroalkyl group such as a trifluoromethyl group, or cyano group may be fused to form a ring.

As used herein, the term "hetero" refers to, unless separately defined, the presence of one to three heteroatoms selected from the group consisting of N, O, S, and P and the remainder of carbon atoms in one functional group.

As used herein, the alkyl group may be a C1-C20 alkyl group. More specifically, the alkyl group may be a C1-C10 alkyl group or a C1-C6 alkyl group. For example, a C1-C4 alkyl group refers to the presence of one to four carbon atoms in an alkyl chain, and may be selected from the group consisting of methyl, ethyl, propyl, iso-propyl, n-butyl, iso-butyl, sec-butyl, and t-butyl.

Specific examples of the alkyl group may include a methyl group, an ethyl group, a propyl group, an iso-propyl group, a butyl group, an iso-butyl group, a t-butyl group, a pentyl group, a hexyl group, a cyclopropyl group, a cyclobutyl group, a cyclopentyl group, a cyclohexyl group, and the like.

The term "aryl group" refers to a substituent in which all elements in the cyclic functional group have p-orbitals while these p-orbitals are conjugated, and includes monocyclic or fused-ring polycyclic (i.e., rings sharing adjacent pairs of carbon atoms) functional groups.

The term "heteroaryl group" refers to the presence of one to three heteroatoms selected from the group consisting of N, O, S, and P and the remainder of carbon atoms in an aryl group. When the heteroaryl group is a fused ring, the heteroaryl group may contain one to three heteroatoms for each ring.

Herein, it will be understood that when an element such as a layer, film, region, or substrate is referred to as being "on" another element, it may be "directly on" the other element or intervening elements may also be present. In contrast, when an element is referred to as being "directly on" another element, there are no intervening elements present.

In an exemplary embodiment of the present invention, a metal precursor powder of which the Gibbs free energy change of hydrogen removal at a temperature range of −25° C. to 25° C. is −100 kJ/mol to 300 kJ/mol is provided.

More specifically, the metal precursor powder may be an aluminum precursor powder, and may be a metal precursor powder of which the Gibbs free energy change of hydrogen removal at a temperature range of −25° C. to 25° C. is −27 kJ/mol to −37 kJ/mol.

In general, the metal precursor powder is subjected to a reduction reaction even at normal temperature, resulting in precipitation of a metal. In this case, many problems may occur in utilizing the metal precursor powder for a metal ink.

The metal precursor powder as in the foregoing embodiment of the present invention has a proper temperature range and a proper range of Gibbs free energy at this temperature range, and thus achieves reaction stability at room temperature.

This metal precursor powder may be stored, prepared into a metal precursor ink, and/or used in a procedure for manufacturing a metal layer or pattern.

More specifically, the metal precursor powder is stored in a stable state, and then prepared into a metal precursor ink at a desired time, so that a metal layer (or pattern) can be manufactured.

Specific examples of the metal precursor may include a metal chloride, a metal hydride, a metal hydroxide, a metal sulfide, a metal nitrate, a metal nitride, a metal halide, a metal alkyl compound, a complex compound thereof, or a combination thereof.

Table 1 below illustrates Gibbs free energy values of various metal precursor powders.

TABLE 1

| Metal precursor powder | Δ G at −25° C. (KJ/mol) | Δ G at 25° C. (KJ/mol) |
|---|---|---|
| $AlH(g)$ | −235.92 | −231.172 |
| $AlH_2(g)$ | −233.669 | −230.882 |
| $AlH_3(g)$ | −212.693 | −213.458 |
| $AlH_3$ | −36.926 | −46.515 |
| $AgH(g)$ | −253.509 | −248.641 |
| $AgH_3(g)$ | −285.302 | −286.361 |
| $AmH_2$ | 149.889 | 143.103 |
| $AsH_3(g)$ | −68.761 | −69.066 |
| $AuH(g)$ | −249.043 | −244.100 |
| $Au (H_3, g)$ | −279.109 | −280.078 |
| $B_{10}H_{14}$ | −169.134 | −208.598 |
| $BaH_2$ | 157.743 | 151.291 |
| $BeH_2$ | −11.441 | −17.500 |
| $LiH$ | 72.035 | 68.366 |
| $NiH(g)$ | −364.701 | −358.879 |
| $CoH(g)$ | −419.096 | −412.863 |
| $CuH_3$ | −282.38 | −283.388 |
| $NaH$ | 37.294 | 33.483 |
| $CaH_2$ | 144.490 | 138.015 |

TABLE 1-continued

| Metal precursor powder | Δ G at −25° C. (KJ/mol) | Δ G at 25° C. (KJ/mol) |
|---|---|---|
| $KH$ | 38.261 | 34.351 |
| $SiH_4(g)$ | −53.206 | −56.823 |
| $RbH$ | 31.535 | 27.379 |

In one embodiment of the present invention, a method of manufacturing a conductive metal layer or pattern is provided, the method including: preparing a metal precursor powder; storing the metal precursor powder in a stable atmosphere in which a decomposition reaction fails to occur; dissolving the stored metal precursor powder in a first solvent to prepare a first metal precursor ink; forming the first metal precursor ink into a layer or pattern on a subject substrate; and decomposing a metal precursor in the formed layer or pattern to form a conductive metal layer or pattern.

In one embodiment of the present invention, is provided a method of manufacturing a conductive metal layer or pattern is provided, the method including: preparing a metal precursor powder; storing the metal precursor powder in a stable atmosphere in which a decomposition reaction fails to occur; dissolving the stored metal precursor powder in a first solvent to prepare a first metal precursor ink; treating a surface of a subject substrate with a metal precursor decomposition activating catalyst; forming the first metal precursor ink into a layer or pattern on the surface of the subject substrate, which is treated with the metal precursor decomposition activating catalyst; and decomposing a metal precursor in the formed layer or pattern to form a conductive metal layer or pattern.

Further, in one embodiment of the present invention, a method of manufacturing a conductive metal layer or pattern is provided, the method including: preparing a metal precursor powder; storing the metal precursor powder in a stable atmosphere in which a decomposition reaction fails to occur; dissolving the stored metal precursor powder in a first solvent to prepare a first metal precursor ink; forming the first metal precursor ink into a layer or pattern on a surface of a subject substrate; treating the formed layer or pattern with a metal precursor decomposition activating catalyst; and decomposing a metal precursor in the formed layer or pattern to form a conductive metal layer or pattern.

As described above, specific examples of the metal precursor may include a metal chloride, a metal hydride, a metal hydroxide, a metal sulfide, a metal nitrate, a metal nitride, a metal halide, a metal alkyl compound, a metal aryl compound, a complex compound thereof, or a combination thereof.

More specific examples of the metal precursor powder may include compounds in which organic and inorganic ligands are, independently or in combination, bound to a metal hydride (MHx). The M is a metal, and may be titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), halfnium (Hf), tantalum (Ta), tungsten (W), rhenium (Re), osmium (Os), iridium (Ir), platinum (Pt), gold (Au), mercury (Hg), aluminum (Al), gallium (Ga), germanium (Ge), indium (In), tin (Zn), antimony (Sb), thallium (Tl), lead (Pb), bismuth (Bi), lithium (Li), beryllium (Be), sodium (Na), magnesium (Mg), potassium (K), calcium (Ca), rubidium (Rb), strontium (Sr), cesium (Cs), barium (Ba), silicon (Si), or the like, and x may be 1 to 7.

In addition, to take a specific example, the metal precursor powder according to an embodiment of the present invention is composed of metal hydride, which is a metal precursor core material, and a compound in which various organic or inorganic ligands are bound to a metal hydride, independently or in a mixture.

More specifically, a core material of the metal precursor powder may be a metal hydride (MHx), and various organic or inorganic materials may be bound to the metal hydride to thereby constitute a more stable and effective aluminum metal precursor. Herein, the metal hydride means a compound in which at least one hydrogen atom is directly bound to a metal. More specifically, it may be represented by $MH_nY_{m-n}$ where Y may be a halogen group element or —OR or —R (herein R may be alkyl, an aryl, an aryl compound, or the like), n may be 7 or smaller, and m may be 1 to 7. The M is a metal and may be titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), halfnium (Hf), tantalum (Ta), tungsten (W), rhenium (Re), osmium (Os), iridium (Ir), platinum (Pt), gold (Au), mercury (Hg), aluminum (Al), gallium (Ga), germanium (Ge), indium (In), tin (Zn), antimony (Sb), thallium (Tl), lead (Pb), bismuth (Bi), lithium (Li), beryllium (Be), sodium (Na), magnesium (Mg), potassium (K), calcium (Ca), rubidium (Rb), strontium (Sr), cesium (Cs), barium (Ba), silicon (Si), or the like.

As another specific example, the metal precursor may be present in a type in which a metal hydride forms a complex together with one or two amine ligands, phosphine ligands, ether ligands, sulfide ligands, thiol ligands, and/or other proper ligands.

However, the present invention is not limited to the above-exemplified materials. For example, the metal precursor is composed of one or more of the following materials: 1) a metal hydride, 2) a C1-C20 alkyl group-bound metal hydride (isobutyl-metal hydride, triisobutyl-metal hydride, dimethyl-metal hydride, etc.), 3) a metal hydride containing one or two ligands such as an amine, a phosphine, an ether, a sulfide, and a thiol. A representative example of the complex may be a metal hydride complex containing a C1-C20 alkyl group-containing an amine having a low molecular weight, such as a trialkylamine (trimethylamine alane, triethylamine alane, tripropylamine alane, dimethylethylamine alane, diethylmethylamine alane, etc.)

However, the metal precursor is not limited to the above materials.

For example, the metal hydride may form a complex together with a bidentate ligand, such as ethyleneamine, tetramethyhydrazine, 2,2-bipyridine, 1,2-bis(diphenylphosphino) ethane, or 1,3-bis(diphynylphosphino)propane, to thereby be a metal precursor.

A general form of this metal precursor may be represented as follows. $[R^1{}_yA]_xMR^2{}_z$, wherein A may be a Group VA element such as N, P, As, or Sb, or a Group VI element such as O, S, Se, or Te; x may be 1 or 2; y may be 2 or 3; and z may be 1 to 8. $R^1$ and $R^2$ may each independently be H, a C1-C20 alkyl group, a C2-C20 alkenyl group, a C2-C20 alkynyl group, a C3-C120 cycloalkyl group, a C4-C120 cycloalkenyl group, a C6-C100 aryl group, or a C7-C100 aralkyl group. In general, A may be a Group VI element when y is 2, and a Group VA element when y is 3.

In addition, a complex of a metal hydride and an amine may also be used as the metal precursor, and a general form thereof may be represented as follows. $[R^1{}_yN]_xMR^2{}_z$, wherein $R^1$ and $R^2$ may each independently be H, a C1-C20 alkyl group, a C2-C20 alkenyl group, a C2-C20 alkynyl group, a C3-C120 cycloalkyl group, a C4-C120 cycloalkenyl group, a C6-C100 aryl group, or a C7-C100 aralkyl group. Further, R groups may be linked to an N atom to form an aliphatic or aromatic cyclic ring. Specifically, an amine group suitable for the metal hydride complex containing an amine group may be a monoalkyl-, dialkyl-, or trialkyl-amine complex, a piperidine or pyrrolidone complex, or the like.

An example of the complex of metal hydride and amine may be a metal hydride-trialkylamine complex, and the trialkylamine may be trimethylamine, triethylamine, tri-n-propylamine, triisoporpylamine, methyldiethylamine, dimethylethylamine, n-propyldimethylamine, or isopropyldiethylamine.

Representative examples of an aluminum metal precursor complex containing an amine may include trimethylamine alane, triethylamine alane, dimethylethylamine alane, diethylmethylamine alane, and a mixture thereof. Still another metal precursor may be a complex of a metal hydride and two amine ligands and/or one phosphine ligand. An example of the general form may be represented by $[R^1{}_3A]_2MR^2{}_z$, wherein A may independently be N or P; z may be 1 to 8; $R^1$ and $R^2$ may each independently be H, a C1-C20 alkyl group, a C2-C20 alkenyl group, a C2-C20 alkynyl group, a C3-C120 cycloalkyl group, a C4-C120 cycloalkenyl group, a C6-C100 aryl group, or a C7-C100 aralkyl group. The amine ligand may be the amine compound as mentioned above.

The form of the phosphine ligand may be represented by $PR^1{}_3$, wherein $R^1$ may be a monoalkyl-, dialkyl-, or trialkyl-phosphine. Specific examples of the trialkylphosphine may include trimethylphosphine, triethylphosphine, tri-t-butylphohsphin, triphenylphosphine, triisopropylphosphine, tricyclohexylphosphine, or the like. A representative example of the aluminum metal precursor having this structure may be $H_3Al\{N(CH_3)_3\}\{P[C(CH_3)_3]\}$.

In addition, the metal precursor may be present in a form in which it contains a metal hydride and an ether and/or other ligands, and a general form thereof may be represented by $R^2{}_3M(AR^1{}_3)(OR^3{}_2)$ or $R^2{}_3A(OR^3{}_2)$. Herein, a ligand represented by $AR^1{}_3$ may be the amine or phosphine ligand as mentioned above; a ligand represented by $OR^3{}_2$ may be an ether ligand; and $R^3$ groups of the ether ligand may independently be H, a C1-C20 alkyl group, a C2-C20 alkenyl group, a C2-C20 alkynyl group, a C3-C120 cycloalkyl group, a C4-C120 cycloalkenyl group, a C6-C100 aryl group, or a C7-C100 aralkyl group. Two $R^3$ groups containing an oxygen atom may be C1-C20 alkyl groups. Here, appropriate examples of the ether ligand may include diethylether, di-n-propylether, di-n-butylether, di-isopropylether, di-t-butylether, methyl-butylether, n-propyl-n-butylether, methyl-t-butylether, ethyl-t-butylether, tetrahydrofuran, and a mixture thereof.

A representative aluminum metal precursor containing this ligand may be represented by $H_3M\{N(CH_3)_3\}\{O(CH_2CH_3)_2\}$. Here, the M is a metal, and may be titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), halfnium (Hf), tantalum (Ta), tungsten (W), rhenium (Re), osmium (Os), iridium (Ir), platinum (Pt), gold (Au), mercury (Hg), aluminum (Al), gallium (Ga), germanium (Ge), indium (In), tin (Zn), antimony (Sb), thallium (Tl), lead (Pb), bismuth (Bi), lithium (Li), beryllium (Be), sodium (Na), magnesium (Mg), potassium (K), calcium (Ca), rubidium (Rb), strontium (Sr), cesium (Cs), barium (Ba), silicon (Si), or the like.

The prepared metal precursor powder has low activation energy necessary for decomposition thereof, and thus may be decomposed even at a normal temperature in the long-time storage.

In one embodiment of the present invention, a stable storage method capable of preventing decomposition of the prepared metal precursor powder for a long time is provided. With respect to an aluminum precursor powder, which is a representative example of the metal precursor powder, it has been reported that aluminum hydride ($AlH_3$), which is a core material of the aluminum precursor powder, is decomposed into Al and hydrogen at 165° C. However, the aluminum hydride is also decomposed at room temperature when a predetermined time passes.

In one embodiment of the present invention, to take a specific example, it has been confirmed that, in order to suppress the decomposition reaction of the aluminum metal precursor powder, the aluminum metal precursor is suitably stored in a temperature of 25° C. or lower, preferably refrigeration-stored in a temperature of 10° C. or lower, and more preferably freeze-stored in a temperature of 0° C. or lower.

The aluminum precursor powder stored in the stable atmosphere may be prepared into an aluminum metal precursor ink by being dissolved in a solvent which does not chemically react with the aluminum precursor powder. This will be described later in more detail.

More specifically, the step of preparing the metal precursor powder may include: preparing a second metal ink by mixing a metal precursor raw material, a reducing agent, a second solvent, and optionally an organic or inorganic ligand raw material; and obtaining the metal precursor powder by removing the solvent in the second metal precursor ink.

To take a specific example, as the reducing agent, sodium hydride ($NaOH_2$), hydrazine ($N_2H_4$), lithium borohydride ($LiBH_4$), sodium borohydride ($NaBH_4$), potassium borohydride ($KBH_4$), lithium aluminum hydride (LAIN, sodium aluminum hydride ($NaAlH_4$), potassium aluminum hydride ($KAlH_4$), and the like may be used independently or in a mixture thereof.

To take a specific example, the first or second solvent is a solution that can dissolve a metal precursor raw material, a metal precursor powder, an organic or inorganic ligand raw material, and/or a reducing agent. As the first or second solvent, an ether-based solvent, a benzene-based solvent, an alkyl sulfide-based solvent, an amide-based solvent, an amine-based solvent, a nitrile-based solvent, an alkane-based solvent, a thiol-based solvent, a halogenated hydrocarbon-based solvent, an alcohol-based solvent, an aldehyde-based solvent, a ketone-based solvent, a mercaptan-based solvent, a carboxylic acid-based solvent, a mineral acid-based solvent, a toluene-based solvent, a polyol-based solvent, and the like may be used independently or in a mixture thereof.

The step of preparing the second metal ink by mixing the metal precursor raw material, the reducing agent, the second solvent, and optionally the organic or inorganic ligand raw material may include mixing the metal precursor raw material, the reducing agent, the second solvent, and optionally the organic or inorganic ligand raw material to induce a reaction, and removing unreacted materials or byproducts.

More specifically, in the removing of the unreacted materials or byproducts, a filter, a centrifugal separator, or a combination thereof may be employed.

In the obtaining of the metal precursor powder by removing the solvent in the second metal precursor ink, a drying oven apparatus, a rotary evaporator apparatus, a freeze-drying apparatus, or a combination thereof may be used.

More specifically, in the storing of the metal precursor powder in the stable atmosphere in which a decomposition reaction fails to occur, the metal precursor powder may be stored at a temperature range of −25° C. to 25° C. Alternatively, the metal precursor powder may be stored in a temperature range of 0° C. to 10° C. (e.g., refrigeration). Alternatively, the metal precursor powder may be stored in a temperature range of −25° C. to 0° C. (e.g., freeze).

The temperature range may be such that the metal precursor powder can be controlled to not be decomposed.

The method of preparing the metal precursor ink using the metal precursor powder may include a procedure of, when the metal precursor ink is needed, dissolving the metal precursor powder in a solvent capable of dissolving the metal precursor powder without a chemical reaction, and a procedure of filtering the residual metal precursor powder or impurities, which are not completely dissolved in the solvent, through a filter and/or a centrifugal separator.

The concentration of the metal precursor contained in the metal precursor ink may be controlled by adjusting the amount of metal precursor powder dissolved in the solvent.

The conventional method of preparing an aluminum metal precursor ink includes mixing aluminum chloride and lithium aluminum hydride at a predetermined mole ratio in a particular solvent to induce a reaction and filtering byproducts through a filter. The amounts of aluminum chloride and lithium aluminum hydride taking part in the reaction can be theoretically known, and thus the amount of aluminum metal precursor powder contained in the finally prepared aluminum metal precursor ink can be estimated. However, in an actual reaction, the above reactants may remain as unreacted materials since the reactants are not completely dissolved in the solvent and reacted with each other. Therefore, an estimated amount of the aluminum metal precursor powder may not be contained in the aluminum metal precursor ink. That is, the amount of aluminum metal precursor powder dissolved in the prepared aluminum metal precursor ink cannot be known.

The aluminum metal precursor ink according to an embodiment of the present invention is prepared by accurately measuring the amount of the aluminum metal precursor powder stored in a stable atmosphere through a weighing apparatus and then dissolving the aluminum metal precursor powder in a predetermined amount of solvent. Therefore, the content of the aluminum metal precursor dissolved in the aluminum metal precursor ink can be accurately confirmed and uniformly maintained.

The metal precursor ink may contain 0.01 to 75 wt % of the metal precursor powder and 25 to 99.99 wt % of the first solvent. However, the present invention is not limited thereto.

More specifically, the method according to one embodiment of the present invention may further include, before and/or after forming the metal precursor ink into the layer or the pattern on the subject substrate, treating the surface of the subject substrate and/or the layer or pattern on the subject substrate with the metal precursor decomposition activating catalyst.

An aluminum metal precursor ink layer or pattern having a predetermined shape, which is formed on the subject substrate through a liquid and/or phase process, is changed into a highly conductive aluminum metal layer through supply of external energy.

The source of energy used here is not limited to a particular type. Any system that can uniformly supply energy to the aluminum metal precursor ink layer, which is formed on a predetermined substrate through a liquid or gas phase process, may be employed.

A representative source of energy may be a heat source, a light source, or the like. Examples of the heat source may preferably include an oven or a furnace that can stably supply heat in a chamber type, a hot gas supply system that supply a predetermined temperature of gas, a hot plate that heats a lower portion of a substrate, and the like. These heat source supply devices may be used independently or in combination. Examples of the light source may preferably include infrared light, ultraviolet light, a laser, a halogen lamp, a mercury lamp, a light source heating system, and the like. These light source supply devices may be used independently or in combination. In addition, the heat source supply devices and the light source supply devices may be used independently or in combination.

In order to minimize the amount of energy supplied during a procedure of transforming the aluminum metal precursor ink into the conductive aluminum metal layer or pattern after the aluminum metal precursor ink is coated to have a predetermined shape on a particular substrate through a liquid and/or gas phase process (for example, in order to form an aluminum film having excellent electrical conductivity at a low temperature of 150° C. or lower), a catalyst capable of lowering activation energy necessary for decomposition of the aluminum metal precursor may be used.

The catalyst used here is not limited to particular kinds of catalysts. Any kind of catalyst that can lower an activation energy necessary for decomposition and thus decompose aluminum hydride ($AlH_3$) at a temperature of lower 150° C. may be used. Here, the aluminum hydride ($AlH_3$) is a core material of an aluminum metal precursor and has been reported to be decomposed at 165° C.

As the catalyst that serves to lower activation energy necessary for decomposition of the aluminum metal precursor, metals belonging to Groups 4B and 5B in the periodic table, materials belonging to the halogen group in the periodic table, and/or alkoxide-based compounds may be preferably used. More specifically, $ZrCl_4$, $NbCl_4$, $VOCl_2$, $VOCl_3$, $TiCl_4 \cdot 2[(C_2H_5)_2O]$, $TiCl_4$, $TiBr_4$, $VCl_4$, $Ti(OC_2H_5)_2Cl_2$, $TiCl_2(i-OC_3H_7)_2$, $TiCl_2 \cdot 2[(C_2H_5)_2O]$, $Ti(O-i-Pr)_4$, $Ti(OEt)_4$, $Ti(OMt)_4$, $Zr(OEt)_4$, $Zr(OMt)_4$, Co, W, Mo, Pd, Pt, and the like may be used independently or in combination.

The catalyst used to lower activation energy necessary for decomposition of the aluminum metal precursor can help form a conductive aluminum metal layer by decomposing the aluminum metal precursor ink, which is coated on the subject substrate or medium through a liquid and/or gas phase process, at a low temperature.

As described above, in order to lower the activation energy necessary for decomposition of the aluminum metal precursor, contact between the aluminum metal precursor ink and the catalyst needs to be induced. Therefore, any method that can induce the contact between the aluminum metal precursor and the catalyst may be employed without limitation to particular methods.

A representative method that can contact the catalyst and the metal precursor ink with each other is as follows, but is not limited thereto. There are a method of diluting the catalyst in a particular solvent, and dipping a substrate or a medium, on which an aluminum metal precursor ink is to be coated, in the catalyst-diluted solution, followed by drying, and a method of vaporizing a solution type of catalyst and exposing a substrate and/or a medium, on which an aluminum metal precursor ink is to be coated or printed, to the vaporized catalyst.

These methods may be used independently or in combination. A highly conductive aluminum metal layer (or pattern) may be formed by forming an aluminum metal precursor ink film (layer or pattern) on the thus catalyst-treated substrate or medium through a liquid and/or gas phase process, and then supplying energy thereto to induce decomposition of the aluminum metal precursor ink, or coating or printing an aluminum metal precursor ink on the catalyst-treated substrate or medium while supplying heat or light energy to the catalyst-treated substrate or medium to thereby induce decomposition of the aluminum metal precursor ink immediately when the aluminum metal precursor ink is coated on the catalyst-treated substrate or medium.

Here, due to an effect of the catalyst, the aluminum conductive layer can be formed by supplying a lower energy as compared with when the catalyst is not used. In addition, the aluminum conductive layer can be effectively formed even without supplying energy although the time for a decomposition reaction of the aluminum metal precursor becomes longer.

As still another method, there is a method of coating and/or printing the aluminum metal precursor ink on a substrate or a particular medium, dipping the treated substrate or medium in a solution type of catalyst, and then supplying energy thereto. The catalyst is also used in this method, and thus the aluminum conductive layer can be effectively formed by supplying a lower energy as compared with when the catalyst is not used.

The step of forming the first metal precursor ink into the layer or the pattern on the subject substrate may be conducted by a liquid phase process such as wet printing used in a printing electronic process or wet coating, and/or a gas phase process such as CVD or ALD.

That is, the highly conductive aluminum layer may be formed by subjecting the prepared aluminum metal precursor ink to a liquid phase process such as wet printing or wet coating and/or a gas phase process such as CVD or ALD and supplying appropriate energy thereto. Here, as the liquid and/or gas phase process, any process and system that can conveniently form the aluminum metal precursor ink into a particular shape of thin film may be utilized without limitation to a particular process.

As the wet printing and wet coating, inkjet printing, screen printing, spin coating, spray coating, dip coating, coating using electrostatic force (electrostatic deposition, electrospray deposition, electrospinning, etc.), gravure printing, offset printing, roll printing, slot-die coating, micro-contact printing, flexography printing, solution-stamping, solution-dipping, and the like may be conducted independently or in combination. Here, according to the solution-stamping process, a metal precursor ink is coated on one clean substrate (hereinafter referred to as substrate A), and the other substrate (hereinafter referred to as substrate B) is placed on a hot plate heated to 50 to 300° C. Then, substrate A is contacted with substrate B such that substrate A is superimposed on substrate B. Also, the solution-dipping process herein means a process in which, while a clean substrate is put in a metal precursor ink, a metal film is formed on a surface of the substrate.

As the method of supplying energy to the metal precursor ink layer, which is formed on the substrate by a liquid and/or gas phase process, a heat source or a light source, or a combination of the two, may be employed.

That is, a particular shape of aluminum metal precursor ink layer which is formed on a particular substrate through a liquid and/or phase process is transformed into a highly conductive aluminum metal layer through supply of external energy. The source of energy used here is not limited to a particular type. Any system that can uniformly supply energy to an aluminum metal precursor ink layer, which is formed on a predetermined substrate through a liquid or gas phase process, may be employed.

As a method of supplying energy as the heat source, there are an oven and a furnace that can stably supply heat in a chamber type, a hot gas supply system that supplies a predetermined temperature of gas, a hot plate that heats a lower portion of a substrate, and the like. These heat source supply devices may be used independently or in combination.

Examples of the light source may preferably be infrared light, ultraviolet light, a laser, a halogen lamp, a xenon lamp, a light source system, and the like. These light source supply devices may be used independently or in combination.

As a method of supplying energy, heat source devices and light source devices may be used independently or in combination.

Alternatively, a metal layer may be formed by forming an aluminum metal precursor ink layer (or pattern) on a substrate or medium, on which the metal layer is to be formed, through a liquid and/or gas phase process, and then supplying energy thereto to induce decomposition of the aluminum metal precursor ink, or coating or printing an aluminum metal precursor ink on the substrate or medium on which the metal layer is to be formed while supplying heat or light energy to the substrate or medium to thereby induce decomposition of the aluminum metal precursor ink immediately when the aluminum metal precursor ink is coated on the substrate or medium.

To take a specific example, before the step of forming the first metal precursor ink into the layer or the pattern on the subject substrate, the temperature of the subject substrate may be raised to 25° C. to 300° C. More specifically, the temperature may be 25° C. to 165° C., but is not limited thereto.

The sheet resistance of the conductive metal layer, which is manufactured by subjecting the metal precursor ink to wet printing and wet coating, may be 0.001 to 500 $\Omega$/sq.

The electrical specific resistivity of the conductive metal layer, which is manufactured by subjecting the metal precursor ink to wet printing and wet coating, may be 1.5 to 500 $\mu\Omega\cdot cm$.

To take a specific example, the subject substrate may be made of titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), halfnium (Hf), tantalum (Ta), tungsten (W), rhenium (Re), osmium (Os), iridium (Ir), platinum (Pt), gold (Au), mercury (Hg), aluminum (Al), gallium (Ga), germanium (Ge), indium (In), tin (Zn), antimony (Sb), thallium (Tl), lead (Pb), bismuth (Bi), lithium (Li), beryllium (Be), sodium (Na), magnesium (Mg), potassium (K), calcium (Ca), rubidium (Rb), strontium (Sr), cesium (Cs), barium (Ba), silicon (Si), and/or oxides thereof, and/or alloys thereof and/or alloy oxides thereof, or the like.

To take another example, the substrate may be formed by using, independently or in combination, polyurethane copolymers such as polyurethane and polyether urethane, cellulose derivatives such as cellulose acetate, cellulose, acetate butyrate, and cellulose acetate propionate, polymethyl methacrylate (PMMA), polymethyl acrylate (PMA), poly acryl copolymers, polyvinyl acetate copolymers, polyvinyl acetate (PVAc), polyvinylpyrrolidone (PVP), polyvinyl alcohol (PVA), polyfurfuryl (PPFA), polystyrene (PS), polystyrene copolymers, polyethylene oxide (PEO), polypropylene oxide (PPO), polyethylene oxide copolymers, polypropylene oxide copolymers, polycarbonate (PC), polyvinyl chloride (PVC), polycaprolactone, polyvinylfluoride, polyvinylidene fluoride copolymers, polyamide, polyethylene terephthalate (PET), polyimide (PI), polyethylene (PE), polydimethyl siloxane (PDMS), and the like.

To take another example, the subject substrate may be formed by using, independently or in combination, paper, fabric, trees, and the like. However, the present invention is not limited thereto.

In another embodiment of the present invention, an electrode including the conductive metal layer manufactured according to an embodiment of the present invention is provided.

In another embodiment of the present invention, any one of electronic devices, optical devices, and/or mechanical devices, which include the conductive metal layer manufactured according to an embodiment of the present invention, can be provided.

Further, in another embodiment of the present invention, a light blocking glass or an electromagnetic wave shielding agent, which includes the conductive metal layer manufactured according to an embodiment of the present invention, can be provided.

In another embodiment of the present invention, an OLED including the electrode according to an embodiment of the present invention is provided.

In still another embodiment of the present invention, a solar cell including the electrode according to an embodiment of the present invention is provided.

In still another embodiment of the present invention, a secondary battery including the electrode according to an embodiment of the present invention is provided.

In still another embodiment of the present invention, a super-capacitor including the charge collector according to an embodiment of the present invention is provided.

In still another embodiment of the present invention, is provided an electric circuit board including the conductive metal layer circuit according to an embodiment of the present invention is provided.

In still another embodiment of the present invention, an RFID including the metal pattern layer according to an embodiment of the present invention is provided.

In still another embodiment of the present invention, an electromagnetic wave shielding material in which the metal layer material according to an embodiment of the present invention is used in shielding of electromagnetic waves is provided.

Hereinafter, specific examples of the present invention will be set forth. However, the following described examples are only for illustrating the present invention more specifically, and thus the scope of the present invention should not be limited by these examples.

EXAMPLE 1

An aluminum metal precursor was prepared by adding $AlCl_3$, $LiAlH_4$, and trimethyl amine (TMA) at a molar ratio of 1:3~6:4 in diethylether, conducting stirring and mixing for 12 hours and then filtering, removing the entire solvent from the remaining clear solution through a rotary evaporator, and then collecting the dried powder.

Figure 2:
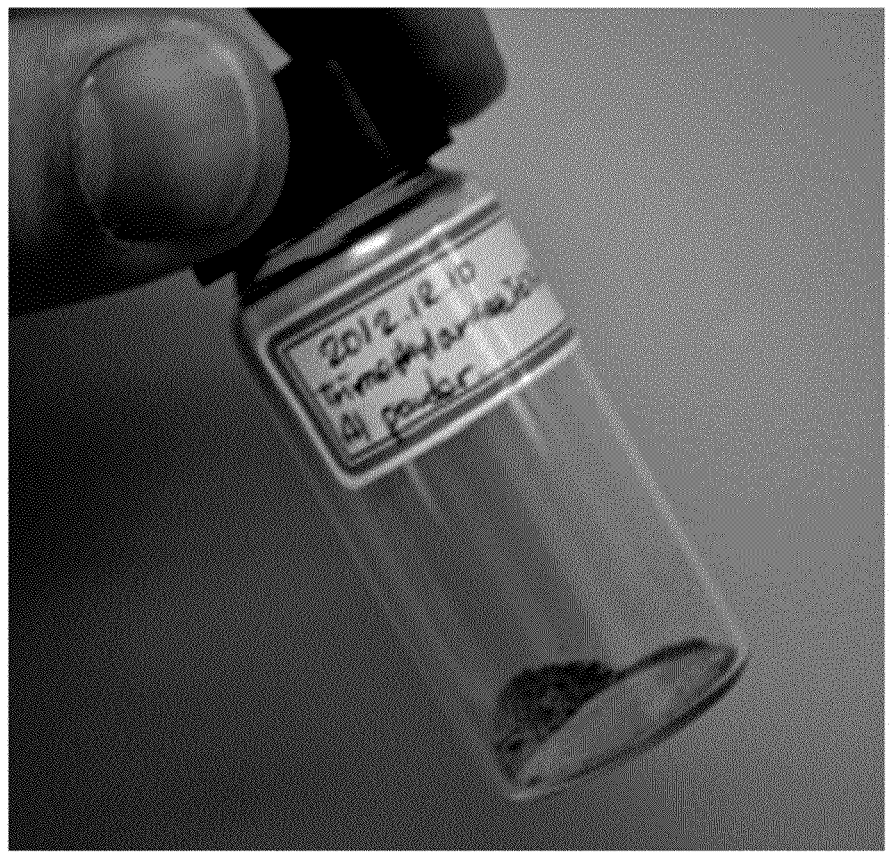
FIG. 2 is a general optical image of an aluminum metal powder prepared by inducing decomposition of the aluminum metal precursor powder according to Example 1.
Figure 3:
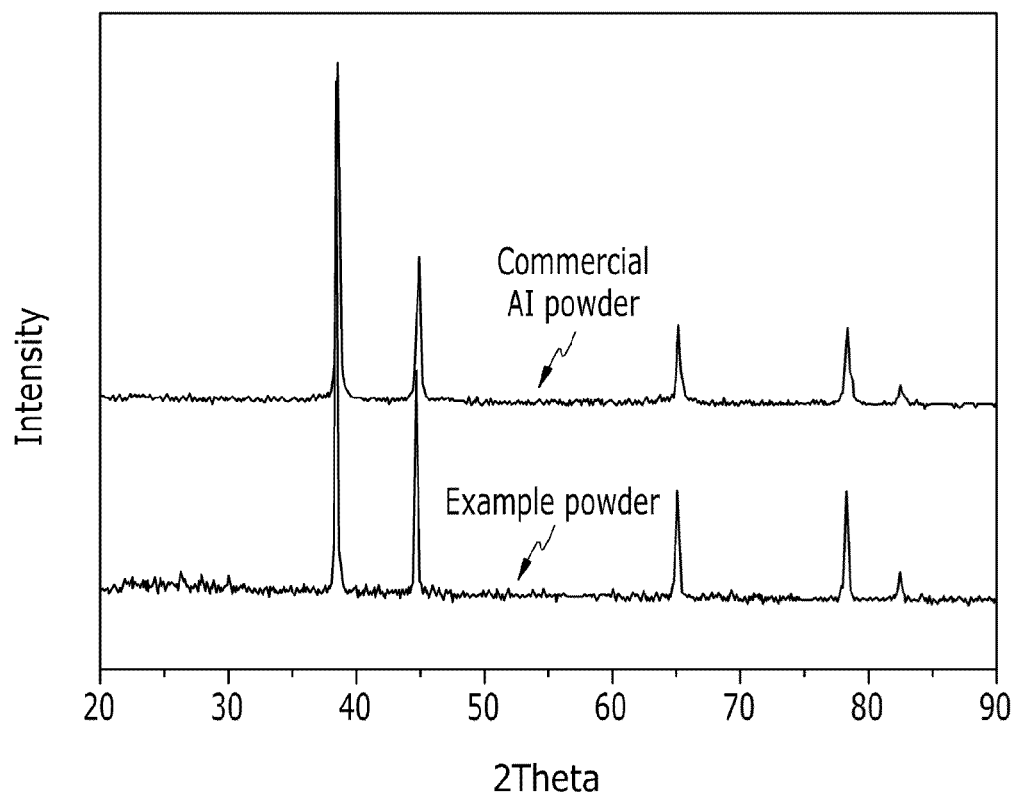
FIG. 3 illustrates XRD analysis comparison results of a commercial Al powder and the powder according to Example 1.

This powder was $AlH_3 \cdot N(CH_3)_3$ and is shown in FIG. 1. As a result of artificially inducing decomposition of the thus prepared powder in order to determine whether the powder is suitably usable in forming an aluminum metal layer, it could be confirmed that a dark gray powder was prepared as shown in FIG. 2. Further, as a result of XRD analysis of the powder, it could be confirmed that an XRD pattern of the powder is identical to that of an aluminum powder on the market, as shown in FIG. 3. Therefore, it could be determined that the aluminum metal precursor powder prepared through the present example may be suitable to prepare an aluminum metal precursor ink.

EXAMPLE 2

An $AlH_3 \cdot N(C_2H_5)_3$ powder was prepared by the same method as in Example 1, except that triethyl amine (TEA) was used instead of trimethyl amine (TMA). As a result of artificially inducing decomposition of the thus prepared powder in order to determine whether the powder is suitably usable in forming an aluminum metal layer, it could be confirmed that a dark gray powder was prepared. Further, as a result of XRD analysis of the powder, it could be confirmed that an XRD pattern of the powder is identical to that of an aluminum powder on the market. Therefore, it could be determined that the aluminum metal precursor powder prepared through the present example may be suitable to prepare an aluminum metal precursor ink.

EXAMPLE 3

An $AlH_3 \cdot N(CH_3)_2(C_2H_5)$ powder was prepared by the same method as in Example 1n except that dimethylethyl amine (DMEA) was used instead of trimethyl amine (TMA). As a result of artificially inducing decomposition of the thus prepared powder in order to determine whether the powder is suitably usable in forming an aluminum metal layer, it could be confirmed that a dark gray powder was prepared. Further, as a result of XRD analysis of the powder, it could be confirmed that an XRD pattern of the powder is identical to that of an aluminum powder on the market. Therefore, it could be determined that the aluminum metal precursor powder prepared through the present example may be suitable to prepare an aluminum metal precursor ink.

EXAMPLE 4

An $AlH_3 \cdot N(C_2H_5)_2(CH_3)$ powder was prepared by the same method as in Example 1, except that diethylmethyl amine (DEMA) was used instead of trimethyl amine (TMA). As a result of artificially inducing decomposition of the thus prepared powder in order to determine whether the powder is suitably usable in forming an aluminum metal layer, it could be confirmed that a dark gray powder was prepared. Further, as a result of XRD analysis of the powder, it could be confirmed that an XRD pattern of the powder is identical to that of an aluminum powder on the market. Therefore, it could be determined that the aluminum metal precursor powder prepared through the present example may be suitable to prepare an aluminum metal precursor ink.

EXAMPLE 5

An $AlH_3 \cdot S(C_2H_5)_2$ powder was prepared by the same method as in Example 1, except that diethylsulfide $(S(C_2H_5)_2)$ was used instead of trimethyl amine (TMA). As a result of artificially inducing decomposition of the thus prepared powder in order to determine whether the powder is suitably usable in forming an aluminum metal layer, it could be confirmed that a dark gray powder was prepared. Further, as a result of XRD analysis of the powder, it could be confirmed that an XRD pattern of the powder is identical to that of an aluminum powder on the market. Therefore, it could be determined that the aluminum metal precursor powder prepared through the present example may be suitable to prepare an aluminum metal precursor ink.

EXAMPLE 6

An $AlH_3 \cdot S(C_4H_9)_2$ powder was prepared by the same method as in Example 1, except that dibutylsulfide $(S(C_4H_9)_2)$ was used instead of trimethyl amine (TMA). As a result of artificially inducing decomposition of the thus prepared powder in order to determine whether the powder is suitably usable in forming an aluminum metal layer, it could be confirmed that a dark gray powder was prepared. Further, as a result of XRD analysis of the powder, it could be confirmed that an XRD pattern of the powder is identical to that of an aluminum powder on the market. Therefore, it could be determined that the aluminum metal precursor powder prepared through the present example may be suitable to prepare an aluminum metal precursor ink.

EXAMPLE 7

An $AlH_3 \cdot O(C_4H_9)_2$ powder was prepared by the same method as in Example 1, except that trimethyl amine (TMA) was not added in the reaction for preparing an aluminum metal precursor. As a result of artificially inducing decomposition of the thus prepared powder in order to determine whether the powder is suitably usable in forming an aluminum metal layer, it could be confirmed that a dark gray powder was prepared. Further, as a result of XRD analysis of the powder, it could be confirmed that an XRD pattern of the powder is identical to that of an aluminum powder on the market. Therefore, it could be determined that the aluminum metal precursor powder prepared through the present example may be suitable to prepare an aluminum metal precursor ink.

EXAMPLE 8

An $AlH_3 \cdot O(C_2H_5)_2$ powder was prepared by the same method as in Example 1, except that trimethyl amine (TMA) was not added in the reaction for preparing an aluminum metal precursor, and as a solvent, diethyl ether $(O(C_2H_5)_2)$ was used instead of dibutylether $(O(C_4H_9)_2)$. As a result of artificially inducing decomposition of the thus prepared powder in order to determine whether the powder is suitably usable in forming an aluminum metal layer, it could be confirmed that a dark gray powder was prepared. Further, as a result of XRD analysis of the powder, it could be confirmed that an XRD pattern of the powder is identical to that of an aluminum powder on the market. Therefore, it could be determined that the aluminum metal precursor powder prepared through the present example may be suitable to prepare an aluminum metal precursor ink.

EXAMPLE 9

Figure 4:
FIG. 4 is an optical image of an aluminum metal precursor ink prepared by dissolving the aluminum metal precursor powder according to Example 1 in a solvent.
Figure 5A:
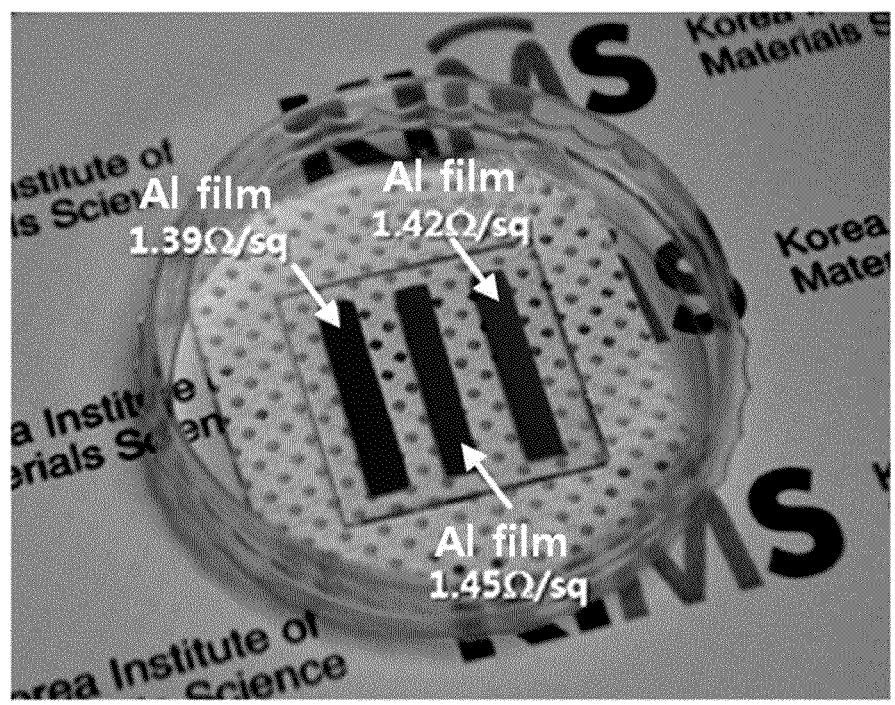
FIG. 5A is an optical image of a conductive aluminum metal layer manufactured by using the aluminum metal precursor ink according to Example 1.

A clear aluminum metal precursor ink as shown in FIG. 4 was prepared by putting 0.1 g of the aluminum metal precursor powder prepared through Example 1 in 5 ml of dibutylether, followed by stirring for about 1 hour and then filtering. Then, a subject substrate (soda lime glass substrate, Dasom RNS Inc.), on which a metal layer is to be formed, was placed on a hot plate, and a substrate, on which an aluminum metal precursor ink was coated and dried, was superimposed on the subject substrate, thereby forming an aluminum metal layer as shown in FIG. 5A. It could be seen that electrical resistance of the formed aluminum metal layer was about 1.4 Ω/□, and thus electrical conductivity of the aluminum metal layer was excellent.

EXAMPLE 9-1

Figure 5B:
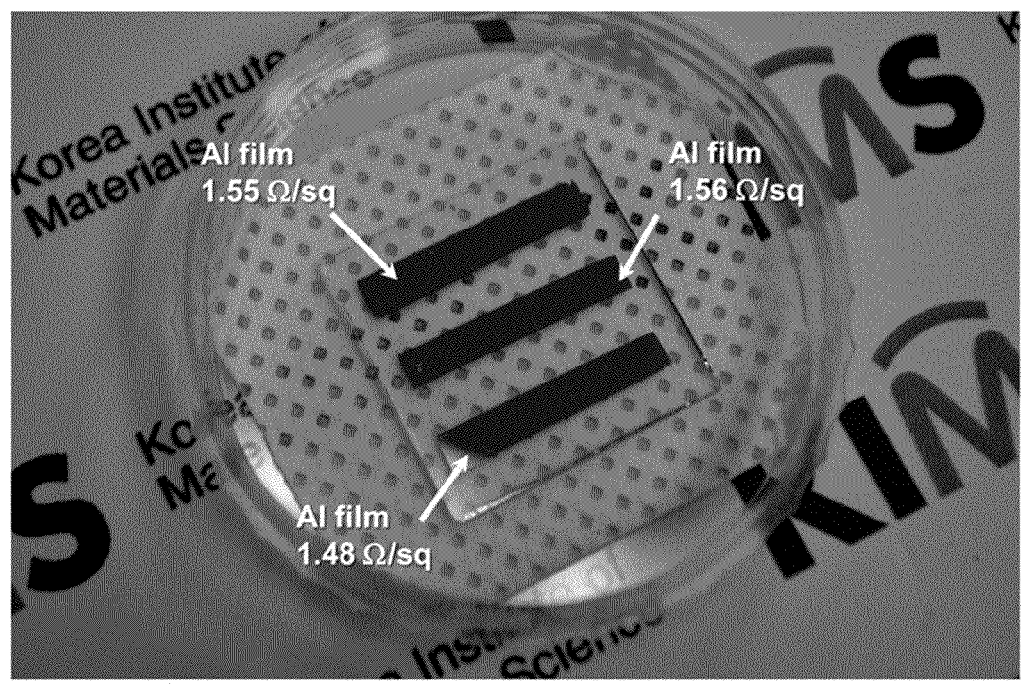
FIG. 5B is an optical image of a conductive aluminum metal layer manufactured by catalytically accelerating the decomposition of the aluminum metal precursor ink according to Example 1.
Figure 6:
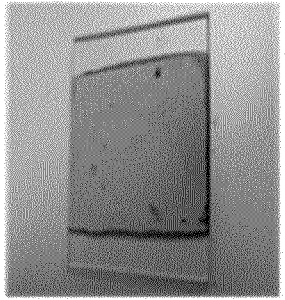
FIG. 6 shows optical images of aluminum metal precursor powders which are refrigeration-stored and freeze-stored, aluminum precursor ink by melting the stored precursor powders in solvent, aluminum film prepared by the produced aluminum precursor ink, and electrical resistances of the prepared aluminum films.

A clear aluminum metal precursor ink solution as shown in FIG. 4 was prepared by putting 0.1 g of the aluminum metal precursor powder prepared through Example 1 in 5 ml of dibutylether, followed by stirring for about 1 hour and then filtering. After about 5 µl of $Ti(O-i-Pr)_4$ used as a catalyst was dripped on a hot plate heated to 100° C. and then evaporated, a subject substrate on which an aluminum coating layer is to be formed was placed therearound, and then the subject substrate was covered with a glass chamber having a punched lower portion to thereby expose a surface of the substrate to an atmosphere of the evaporated catalyst, thereby catalytically treating the substrate. The prepared aluminum metal precursor powder ink solution was coated on the other substrate through drip-casting, and then dried. After that, the catalytically treated substrate was placed on the hot plate heated to 100° C., and then the substrate on which the aluminum metal precursor powder ink solution was coated and dried was superimposed thereon, so that a surface of the catalytically treated substrate was contacted with a surface of the substrate on which the aluminum metal precursor powder ink solution was coated and dried, to form an aluminum metal layer as shown in FIG. 5B. It could be seen that electrical resistance of the formed aluminum metal layer was about 1.53 Ω/□, and thus electrical conductivity of the aluminum metal layer was excellent.

EXAMPLE 10

An aluminum metal layer was formed by the same method as in Example 9, except that an aluminum metal precursor ink prepared by using the aluminum metal precursor powder prepared through Example 2 was used instead of the aluminum metal precursor ink prepared by using the aluminum metal precursor powder prepared through Example 1. It could be seen that electrical resistance of the formed aluminum metal layer was about 1.6 Ω/□, and thus electrical conductivity of the aluminum metal layer was excellent.

EXAMPLE 10-1

An aluminum metal layer was formed by the same method as in Example 9-1, except that an aluminum metal precursor ink solution prepared by using the aluminum metal precursor powder prepared through Example 2 was used instead of the aluminum metal precursor ink solution prepared by using the aluminum metal precursor powder prepared through Example 1. It could be seen that electrical resistance of the formed aluminum metal layer was about 1.56 Ω/□, and thus electrical conductivity of the aluminum metal layer was excellent.

EXAMPLE 11

An aluminum metal layer was formed by the same method as in Example 9, except that an aluminum metal precursor ink prepared by using the aluminum metal precursor powder prepared through Example 3 was used instead of the aluminum metal precursor ink prepared by using the aluminum metal precursor powder prepared through Example 1. It could be seen that electrical resistance of the formed aluminum metal layer was about 1.8 Ω/□, and thus electrical conductivity of the aluminum metal layer was excellent.

EXAMPLE 11-1

An aluminum metal layer was formed by the same method as in Example 9-1, except that an aluminum metal precursor ink solution prepared by using the aluminum metal precursor powder prepared through Example 3 was used instead of the aluminum metal precursor ink solution prepared by using the aluminum metal precursor powder prepared through Example 1. It could be seen that electrical resistance of the formed aluminum metal layer was about 1.60 Ω/□, and thus electrical conductivity of the aluminum metal layer was excellent.

EXAMPLE 12

An aluminum metal layer was formed by the same method as in Example 9, except that an aluminum metal precursor ink prepared by using the aluminum metal precursor powder prepared through Example 4 was used instead of the aluminum metal precursor ink prepared by using the aluminum metal precursor powder prepared through Example 1. It could be seen that electrical resistance of the formed aluminum metal layer was about 1.5 Ω/□, and thus electrical conductivity of the aluminum metal layer was excellent.

EXAMPLE 12-1

An aluminum metal layer was formed by the same method as in Example 9-1, except that an aluminum metal precursor ink solution prepared by using the aluminum metal precursor powder prepared through Example 4 was used instead of the aluminum metal precursor ink solution prepared by using the aluminum metal precursor powder prepared through Example 1. It could be seen that electrical resistance of the formed aluminum metal layer was about 1.45 Ω/□, and thus electrical conductivity of the aluminum metal layer was excellent.

EXAMPLE 13

An aluminum metal layer was formed by the same method as in Example 9, except that an aluminum metal precursor ink prepared by using the aluminum metal precursor powder prepared through Example 5 was used instead of the aluminum metal precursor ink prepared by using the aluminum metal precursor powder prepared through Example 1. It could be seen that electrical resistance of the formed aluminum metal layer was about 1.3 Ω/□, and thus electrical conductivity of the aluminum metal layer very excellent.

EXAMPLE 13-1

An aluminum metal layer was formed by the same method as in Example 9-1, except that an aluminum metal precursor ink solution prepared by using the aluminum metal precursor powder prepared through Example 5 was used instead of the aluminum metal precursor ink solution prepared by using the aluminum metal precursor powder prepared through Example 1. It could be seen that electrical resistance of the formed aluminum metal layer was about 1.43 Ω/□, and thus electrical conductivity of the aluminum metal layer was excellent.

EXAMPLE 14

An aluminum metal layer was formed by the same method as in Example 9, except that an aluminum metal precursor ink prepared by using the aluminum metal precursor powder prepared through Example 6 was used instead of the aluminum metal precursor ink prepared by using the aluminum metal precursor powder prepared through Example 1. It could be seen that electrical resistance of the formed aluminum metal layer was about 1.4 Ω/□, and thus electrical conductivity of the aluminum metal layer was excellent.

EXAMPLE 14-1

An aluminum metal layer was formed by the same method as in Example 9-1, except that an aluminum metal precursor ink solution prepared by using the aluminum metal precursor powder prepared through Example 6 was used instead of the aluminum metal precursor ink solution prepared by using the aluminum metal precursor powder prepared through Example 1. It could be seen that electrical resistance of the formed aluminum metal layer was about 1.54 Ω/□, and thus electrical conductivity of the aluminum metal layer was excellent.

EXAMPLE 15

An aluminum metal layer was formed by the same method as in Example 9, except that an aluminum metal precursor ink prepared by using the aluminum metal precursor powder prepared through Example 7 was used instead of the aluminum metal precursor ink prepared by using the aluminum metal precursor powder prepared through Example 1. It could be seen that electrical resistance of the formed aluminum metal layer was about 1.6 Ω/□, and thus electrical conductivity of the aluminum metal layer was excellent.

EXAMPLE 15-1

An aluminum metal layer was formed by the same method as in Example 9-1, except that an aluminum metal precursor ink solution prepared by using the aluminum metal precursor powder prepared through Example 7 was used instead of the aluminum metal precursor ink solution prepared by using the aluminum metal precursor powder prepared through Example 1. It could be seen that electrical resistance of the formed aluminum metal layer was about 1.61, and thus electrical conductivity of the aluminum metal layer was excellent.

EXAMPLE 16

An aluminum metal layer was formed by the same method as in Example 9, except that an aluminum metal precursor ink prepared by using the aluminum metal precursor powder prepared through Example 8 was used instead of the aluminum metal precursor ink prepared by using the aluminum metal precursor powder prepared through Example 1. It could be seen that electrical resistance of the formed aluminum metal layer was about 1.3 Ω/□, and thus electrical conductivity of the aluminum metal layer was excellent.

EXAMPLE 16-1

An aluminum metal layer was formed by the same method as in Example 9-1, except that an aluminum metal precursor ink solution prepared by using the aluminum metal precursor powder prepared through Example 8 was used instead of the aluminum metal precursor ink solution prepared by using the aluminum metal precursor powder prepared through Example 1. It could be seen that electrical resistance of the formed aluminum metal layer was about 1.45, and thus electrical conductivity of the aluminum metal layer was excellent.

EXAMPLE 17

The aluminum metal precursor powders prepared in Example 1 were refrigeration-stored at 10° C. and freeze-stored at −20° C. for 3 months, respectively, and taken out therefrom, and then the same experiment as in Example 9 was repeated. As a result, it could be confirmed that aluminum metal layers exhibiting electrical resistances of about 1.5 Ω/□ and about 1.4 Ω/□, thus having excellent electrical conductivity, were formed without difficulty.

EXAMPLE 17-1

The aluminum metal precursor powders prepared in Example 1 were refrigeration-stored at 10° C. and freeze-stored at −20° C. for 3 months, and taken out therefrom, and then the same experiment as in Example 9-1 was repeated. As a result, it could be confirmed that aluminum metal layers exhibiting electrical resistances of about 1.45 Ω/□ and about 1.54 Ω/□, and thus having excellent electrical conductivity, were formed without difficulty.

EXAMPLE 18

The aluminum metal precursor powders prepared in Example 2 were refrigeration-stored at 10° C. and freeze-stored at −20° C. for 3 months, respectively, and taken out therefrom, and then the same experiment as in Example 10 was repeated. As a result, it could be confirmed that aluminum metal layers exhibiting electrical resistances of about 1.6 Ω/□ and about 1.4 Ω/□, and thus having excellent electrical conductivity, were formed without difficulty.

EXAMPLE 18-1

The aluminum metal precursor powders prepared in Example 2 were refrigeration-stored at 10° C. and freeze-stored at −20° C. for 3 months, and taken out therefrom, and then the same experiment as in Example 10-1 was repeated. As a result, it could be confirmed that aluminum metal layers exhibiting electrical resistances of about 1.56 Ω/□ and about 1.34 Ω/□, and thus having excellent electrical conductivity, were formed without difficulty.

EXAMPLE 19

The aluminum metal precursor powders prepared in Example 3 were refrigeration-stored at 10° C. and freeze-stored at −20° C. for 3 months, respectively, and taken out therefrom, and then the same experiment as in Example 11 was repeated. As a result, it could be confirmed that aluminum metal layers exhibiting electrical resistances of about 1.6 Ω/□ and about 1.3 Ω/□, and thus having excellent electrical conductivity, were formed without difficulty.

EXAMPLE 19-1

The aluminum metal precursor powders prepared in Example 3 were refrigeration-stored at 10° C. and freeze-stored at −20° C. for 3 months, and taken out therefrom, and then the same experiment as in Example 11-1 was repeated. As a result, it could be confirmed that aluminum metal layers exhibiting electrical resistances of about 1.46 Ω/□ and about 1.43 Ω/□, and thus having excellent electrical conductivity, were formed without difficulty.

EXAMPLE 20

The aluminum metal precursor powders prepared in Example 4 were refrigeration-stored at 10° C. and freeze-stored at −20° C. for 3 months, respectively, and taken out therefrom, and then the same experiment as in Example 12 was repeated. As a result, it could be confirmed that aluminum metal layers exhibiting electrical resistances of about 1.5 Ω/□ and about 1.3 Ω/□, and thus having excellent electrical conductivity, were formed without difficulty.

EXAMPLE 20-1

The aluminum metal precursor powders prepared in Example 4 were refrigeration-stored at 10° C. and freeze-stored at −20° C. for 3 months, and taken out therefrom, and then the same experiment as in Example 12-1 was repeated. As a result, it could be confirmed that aluminum metal layers exhibiting electrical resistances of about 1.55 Ω/□ and about 1.53 Ω/□, and thus having excellent electrical conductivity, were formed without difficulty.

EXAMPLE 21

The aluminum metal precursor powders prepared in Example 5 were refrigeration-stored at 10° C. and freeze-stored at −20° C. for 3 months, respectively, and taken out therefrom, and then the same experiment as in Example 13 was repeated. As a result, it could be confirmed that aluminum metal layers exhibiting electrical resistances of about 1.3 Ω/□ and about 1.4 Ω/□, and thus having excellent electrical conductivity, were formed without difficulty.

EXAMPLE 21-1

The aluminum metal precursor powders prepared in Example 5 were refrigeration-stored at 10° C. and freeze-stored at −20° C. for 3 months, and taken out therefrom, and then the same experiment as in Example 13-1 was repeated. As a result, it could be confirmed that aluminum metal layers exhibiting electrical resistances of about 1.34 Ω/□ and about 1.45 Ω/□, and thus having excellent electrical conductivity, were formed without difficulty.

EXAMPLE 22

The aluminum metal precursor powders prepared in Example 6 were refrigeration-stored at 10° C. and freeze-stored at −20° C. for 3 months, respectively, and taken out therefrom, and then the same experiment as in Example 14 was repeated. As a result, it could be confirmed that aluminum metal layers exhibiting electrical resistances of about 1.5 Ω/□ and about 1.4 Ω/□, and thus having excellent electrical conductivity, were formed without difficulty.

EXAMPLE 22-1

The aluminum metal precursor powders prepared in Example 6 were refrigeration-stored at 10° C. and freeze-stored at −20° C. for 3 months, and taken out therefrom, and then the same experiment as in Example 14-1 was repeated. As a result, it could be confirmed that aluminum metal layers exhibiting electrical resistances of about 1.45 Ω/□ and about 1.48 Ω/□, and thus having excellent electrical conductivity, were formed without difficulty.

EXAMPLE 23

The aluminum metal precursor powders prepared in Example 7 were refrigeration-stored at 10° C. and freeze-stored at −20° C. for 3 months, respectively, and taken out therefrom, and then the same experiment as in Example 15 was repeated. As a result, it could be confirmed that aluminum metal layers exhibiting electrical resistances of about 1.7 Ω/□ and about 1.5 Ω/□, and thus having excellent electrical conductivity, were formed without difficulty.

EXAMPLE 23-1

The aluminum metal precursor powders prepared in Example 7 were refrigeration-stored at 10° C. and freeze-stored at −20° C. for 3 months, and taken out therefrom, and then the same experiment as in Example 15-1 was repeated. As a result, it could be confirmed that aluminum metal layers exhibiting electrical resistances of about 1.72 Ω/□ and about 1.56 Ω/□, and thus having excellent electrical conductivity, were formed without difficulty.

EXAMPLE 24

The aluminum metal precursor powders prepared in Example 8 were refrigeration-stored at 10° C. and freeze-stored at −20° C. for 3 months, respectively, and taken out therefrom, and then the same experiment as in Example 16 was repeated. As a result, it could be confirmed that aluminum metal layers exhibiting electrical resistances of about 1.6 Ω/□ and about 1.3 Ω/□, and thus having excellent electrical conductivity, were formed without difficulty.

EXAMPLE 24-1

The aluminum metal precursor powders prepared in Example 8 were refrigeration-stored at 10° C. and freeze-stored at −20° C. for 3 months, and taken out therefrom, and then the same experiment as in Example 16-1 was repeated. As a result, it could be confirmed that aluminum metal layers exhibiting electrical resistances of about 1.68 Ω/□ and about 1.43 Ω/□, and thus having excellent electrical conductivity, were formed without difficulty.

The present invention is not limited to the embodiments, but may be implemented into different forms, and those skilled in the art will understand that the present invention may be implemented in alternative embodiments without changing technical spirits and necessary characteristics of the present invention. Thus, the embodiments described above should be construed as being exemplary and not limiting the present disclosure.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A method of manufacturing a conductive metal layer or pattern, the method comprising:
preparing a metal precursor powder;
storing the metal precursor powder in a stable atmosphere in which a decomposition reaction fails to occur;

dissolving the stored metal precursor powder in a first solvent to prepare a first metal precursor ink;
forming the first metal precursor ink into a layer or pattern on a subject substrate;
decomposing a metal precursor in the formed layer or pattern to form a conductive metal layer or pattern;
preparing a second metal ink by mixing a metal precursor raw material, a reducing agent, a second solvent, and optionally an organic or inorganic ligand raw material; and
removing the solvent in the second metal precursor ink to obtain the metal precursor powder.

2. The method of claim 1, wherein the preparing of the second metal ink by mixing the metal precursor raw material, the reducing agent, the second solvent, and optionally the organic or inorganic ligand raw material comprises mixing the metal precursor raw material, the reducing agent, the second solvent, and optionally the organic or inorganic ligand raw material to induce a reaction, and removing unreacted materials or byproducts.

3. The method of claim 2, wherein, in the mixing of the metal precursor raw material, the reducing agent, the second solvent, and optionally the organic or inorganic ligand raw material to induce the reaction, and the removing of the unreacted materials or byproducts, the unreacted materials or byproducts are removed by using a filter, a centrifugal separator, or a combination thereof.

4. The method of claim 1, wherein the first solvent and the second solvent are each independently an ether-based solvent, a benzene-based solvent, an alkyl sulfide-based solvent, an amide-based solvent, an amine-based solvent, a nitrile-based solvent, an alkane-based solvent, a thiol-based solvent, a halogenated hydrocarbon-based solvent, an alcohol-based solvent, an aldehyde-based solvent, a ketone-based solvent, a mercaptan-based solvent, a carboxylic acid-based solvent, a mineral acid-based solvent, a toluene-based solvent, a polyol-based solvent, or a combination thereof.

5. The method of claim 1, wherein, in the removing the solvent in the second metal precursor ink to obtain the metal precursor powder, a drying oven apparatus, a rotary evaporator apparatus, a freeze-drying apparatus, or a combination thereof is used.

6. The method of claim 1, wherein, in the storing of the metal precursor powder in the stable atmosphere in which a decomposition reaction fails to occur, the metal precursor powder is stored at a temperature range of −25.degree. C. to 25.degree. C.

7. The method of claim 1, wherein, in the storing of the metal precursor powder in the stable atmosphere in which a decomposition reaction fails to occur, the metal precursor powder is stored at a temperature range of 0.degree. C. to 10.degree. C.

8. The method of claim 1, wherein, in the storing of the metal precursor powder in the stable atmosphere in which a decomposition reaction fails to occur, the metal precursor powder is stored at a temperature range of −25.degree. C. to 0.degree. C.

9. The method of claim 1, wherein, in the dissolving of the stored metal precursor powder in the first solvent to prepare the first metal precursor ink, metal precursor powder residues or impurity residues are removed by using a filter, a centrifugal separator, or a combination thereof.

10. The method of claim 1, wherein in the dissolving of the stored metal precursor powder in the first solvent to prepare the first metal precursor ink, the first metal precursor ink contains 0.01 to 75 wt % of the metal precursor powder and 25 to 99.99 wt % of the first solvent.

11. The method of claim 1, wherein in the forming of the first metal precursor ink into the layer or pattern on the subject substrate, a liquid or gas phase process is conducted.

12. The method of claim 1, wherein, in the decomposing of the metal precursor in the formed layer or pattern to form a conductive metal layer or pattern, a heat source, a light source, or a combination thereof is used to supply energy to induce the decomposition of the metal precursor in the layer or pattern formed on the substrate.

13. The method of claim 1, further comprising, before the forming of the first metal precursor ink into the layer or pattern on the subject substrate, raising the temperature of the subject substrate to 25.degree. C. to 300.degree. C.

14. The method of claim 1, wherein in the decomposing of the metal precursor in the formed layer or pattern to form a conductive metal layer or pattern, the formed conductive metal layer or pattern has electrical specific resistivity of 1.5 to 500 .mu..OMEGA.cm.

15. The method of claim 1, the method further comprising:
treating a surface of a subject substrate with a metal precursor decomposition activating catalyst; and
forming the first metal precursor ink into a layer or pattern on the surface of the subject substrate, which is treated with the metal precursor decomposition activating catalyst.

16. The method of claim 15, wherein, in the decomposing of the metal precursor in the formed layer or pattern to form the conductive metal layer or pattern, energy for inducing the decomposition of the metal precursor in the layer or pattern formed on the substrate is supplied by using a heat source, a light source, or a combination thereof.

17. The method of claim 15, wherein, in the treating of the surface of the subject substrate with the metal precursor decomposition activating catalyst, the treating is conducted by directly exposing the surface of the subject substrate to the metal precursor decomposition activating catalyst.

18. The method of claim 17, wherein, in the treating of the surface of the subject substrate with the metal precursor decomposition activating catalyst, the subject substrate is dipped in the metal precursor decomposition activating catalyst.

19. The method of claim 17, wherein, in the treating of the surface of the subject substrate with the metal precursor decomposition activating catalyst, the subject substrate is stored in a chamber containing a fumed metal precursor decomposition activating catalyst.

20. The method of claim 15, wherein the metal precursor decomposition activating catalyst is a combination of a group 4B or 5B metal and a halogen group element, or an alkoxide material.

21. The method of claim 20, wherein the metal precursor decomposition activating catalyst is ZrCl.sub.4, NbCl.sub.4, VOCl.sub.2, VOCl.sub.3, TiCl.sub.4.quadrature.2 [(C.sub.2H.sub.5).sub.2O], TiCl.sub.4, TiBr.sub.4, VCl.sub.4, Ti(OC.sub.2H.sub.5).sub.2Cl.sub.2, TiCl.sub.2(i-OC.sub.3H.sub.7).sub.2, TiCl.sub.2.quadrature.2 [(C.sub.2H.sub.5).sub.2O], Ti(O-i-Pr).sub.4, Ti(OEt).sub.4, Ti(OMt).sub.4, Zr(OEt).sub.4, Zr(OMt).sub.4, Co, W, Mo, Pd, Pt, or a mixture thereof.

22. The method of claim 15, wherein, in the decomposing of the metal precursor in the formed layer or pattern to form the conductive metal layer or pattern, the formed conductive metal layer or pattern has electrical specific resistivity of 1.5 to 500.mu..OMEGA.cm.

23. The method of claim 1, the method further comprising:
treating the formed layer or pattern with a metal precursor decomposition activating catalyst.

24. A device comprising the conductive metal layer or pattern manufactured by the method of claim 1, the device being any one of an electronic device, an optical device, and/or a mechanical device.

* * * * *